United States Patent
Kayukawa et al.

(10) Patent No.: US 7,659,127 B2
(45) Date of Patent: Feb. 9, 2010

(54) MANUFACTURING DEVICE OF SEMICONDUCTOR PACKAGE AND MANUFACTURING METHOD OF SEMICONDUCTOR PACKAGE

(75) Inventors: Kimiharu Kayukawa, Nisshin (JP); Michihiro Masuda, Anjo (JP); Takashige Saitoh, Ama-gun (JP)

(73) Assignee: DENSO CORPORATION, Kariya (JP)

( * ) Notice: Subject to any disclaimer, the term of this patent is extended or adjusted under 35 U.S.C. 154(b) by 257 days.

(21) Appl. No.: 11/882,136

(22) Filed: Jul. 31, 2007

(65) Prior Publication Data

US 2008/0090313 A1    Apr. 17, 2008

(30) Foreign Application Priority Data

Oct. 11, 2006    (JP)    ............................. 2006-278086

(51) Int. Cl.
*H01L 21/00*    (2006.01)
(52) U.S. Cl. .............................. 438/15; 438/14; 438/11
(58) Field of Classification Search ............. 438/14–15, 438/11
See application file for complete search history.

(56) References Cited

U.S. PATENT DOCUMENTS

| | | | |
|---|---|---|---|
| 6,107,107 A * | 8/2000 | Bruce et al. .................... 438/14 |
| 6,348,364 B1 * | 2/2002 | Bruce et al. .................. 438/108 |
| 6,375,347 B1 * | 4/2002 | Bruce et al. ..................... 374/5 |
| 6,921,719 B2 * | 7/2005 | Paterson et al. ............. 438/704 |
| 6,927,079 B1 * | 8/2005 | Fyfield ......................... 438/14 |
| 7,332,718 B2 * | 2/2008 | Okamura et al. .......... 250/341.1 |
| 2004/0124358 A1 * | 7/2004 | Okamura et al. .......... 250/341.1 |
| 2008/0090313 A1 * | 4/2008 | Kayukawa et al. ............. 438/15 |

FOREIGN PATENT DOCUMENTS

| | | |
|---|---|---|
| JP | A-03-093244 | 4/1991 |
| JP | A-2001-060605 | 3/2001 |
| JP | A-2003-347336 | 12/2003 |
| JP | A-2004-214481 | 7/2004 |
| JP | 2008058280 A * | 3/2008 |

* cited by examiner

*Primary Examiner*—Laura M Menz
(74) *Attorney, Agent, or Firm*—Posz Law Group, PLC

(57) ABSTRACT

A manufacturing device of a semiconductor package includes: a holding element for holding a substrate; a bonding element for holding the package and bonding a first metal bump of the package to a second metal bump of the substrate; a monitoring element for irradiating an infrared light toward the substrate and monitoring an electrode pad under the second metal bump based on a reflected light reflected on the pad; and a determination element for determining a state of a bonding surface between the first and second metal bumps based on monitoring information of the pad. The monitoring element faces the bonding element through the holding element, the substrate and the package.

18 Claims, 6 Drawing Sheets

MANUFACTURING DEVICE OF SEMICONDUCTOR PACKAGE AND MANUFACTURING METHOD OF SEMICONDUCTOR PACKAGE

CROSS REFERENCE TO RELATED APPLICATION

This application is based on Japanese Patent Application No. 2006-278086 filed on Oct. 11, 2006, the disclosure of which is incorporated herein by reference.

FIELD OF THE INVENTION

The present invention relates to a manufacturing device of a semiconductor package and a manufacturing method of a semiconductor package.

BACKGROUND OF THE INVENTION

For example, a technique described in JP-A-2001-60605 is formerly known as the manufacturing device of the semiconductor package and the manufacturing method of the semiconductor package of this kind. In this technique, for example, a wiring electrode constructed by aluminum (Al) is first formed on a semiconductor package surface. On the other hand, a metallic bump constructed by e.g., gold (Au) is formed on an electrode pad arranged on a mounting substrate and constructed by e.g., aluminum (Al). When the semiconductor package is mounted to the mounting substrate, the wiring electrode of the semiconductor package and the metallic bump of the mounting substrate are opposed and come in contact with each other. Pressure and ultrasonic vibration are then applied to these wiring electrode and metallic bump. As its result, the wiring electrode and the metallic bump are joined in a solid phase, and an Au—Al alloy film is generated. Thus, the semiconductor package is mounted to the mounting substrate by a so-called flip chip joining method.

In such a related art, the above semiconductor package is formed from a material (e.g., silicon, etc.) able to transmit infrared light in advance. Next, after a joining process of the wiring electrode and the metallic bump is terminated, these are conveyed to equipment different from equipment executing this joining process, and an image of the joining portion of the wiring metal and the metallic bump is picked up by using e.g., the infrared light over the above semiconductor package. As an inspecting process, a state of the joining portion of the wiring electrode and the metallic bump is then inspected on the basis of image information obtained in this way. Thus, the state of the joining portion is inspected as an independent inspecting process after the joining process. Therefore, the semiconductor package evaluated as an unpreferable state of the joining portion is not flowed to a subsequent process, but can be excluded. The semiconductor package evaluated as a preferable state of the joining portion can be flowed to the subsequent process. In its turn, generation of an inferior product can be restrained. However, after the termination of the joining process, it is necessary to convey the above semiconductor package to the different equipment for executing the inspecting process. Therefore, a reduction of production efficiency of the semiconductor package is caused.

Thus, it is required to provide a manufacturing device of the semiconductor package and a manufacturing method of the semiconductor package able to improve production efficiency while the generation of an inferior product is restrained.

SUMMARY OF THE INVENTION

In view of the above-described problem, it is an object of the present disclosure to provide a manufacturing device of a semiconductor package and a manufacturing method of a semiconductor package.

According to a first aspect of the present disclosure, a manufacturing device of a semiconductor package for bonding a first metal bump of the semiconductor package to a second metal bump of a substrate, wherein the second metal bump is disposed on an electrode pad of the substrate, the device includes: a holding element for holding the substrate; a bonding element for holding the semiconductor package, and for bonding the first metal bump to the second metal bump; a monitoring element for irradiating an infrared light toward the substrate together with the holding element from a backside of the substrate, for observing a reflected light, and for monitoring the electrode pad disposed under the second metal bump based on the reflected light, wherein the infrared light penetrates the holding element and the substrate, and reflected on the electrode pad so that the reflected light is provided; and a determination element for determining a state of a bonding surface between the first metal bump and the second metal bump based on monitoring information of the electrode pad. The monitoring element faces the bonding element through the holding element, the substrate and the package.

In the above device, the semiconductor package judged as an not-preferable bonding state through a determination element is not flowed to a subsequent process and is excluded. On the other hand, the semiconductor package determined as a preferable bonding state through the determination element is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved.

According to a second aspect of the present disclosure, a manufacturing device for manufacturing a semiconductor package in such a manner that a first metal bump for providing a circuit of the semiconductor package is bonded to a second metal bump for providing a circuit of a substrate, and that a third metal bump for determining a bonding state between the first and second metal bumps is bonded to a fourth metal bump for determining the bonding state, wherein the first and third metal bumps are disposed on the semiconductor package, and wherein the second metal bump is disposed on an electrode pad of the substrate, and the fourth metal bump is disposed on another electrode pad of the substrate, the device includes: a holding element for holding the substrate; a bonding element for holding the semiconductor package, and for bonding the first metal bump to the second metal bump, and bonding the third metal bump to the fourth metal bump; a monitoring element for irradiating an infrared light toward the substrate together with the holding element from a backside of the substrate, for observing a reflected light, and for monitoring the another electrode pad disposed under the fourth bump based on the reflected light, wherein the infrared light penetrates the holding element and the substrate, and reflected on the another electrode pad so that the reflected light is provided; and a determination element for determining the bonding state between the first metal bump and the second metal bump based on monitoring information of the another electrode pad. The monitoring element faces the bonding element through the holding element, the substrate and the package.

In the above device, the semiconductor package judged as an not-preferable bonding state through a determination element is not flowed to a subsequent process and is excluded. On the other hand, the semiconductor package determined as a preferable bonding state through the determination element is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved. Specifically, it is possible to judge whether the bonding state of the first metallic bump and the second metallic bump is good or not on the basis of the monitoring information obtained by monitoring the portion just below the electrode pad forming the fourth metallic bump.

According to a third aspect of the present disclosure, a manufacturing method for a semiconductor package includes: holding a substrate and the semiconductor package on a holding member; bonding a first metal bump for a circuit of the semiconductor package to a second metal bump for a circuit of the substrate with using a bonding element, wherein the second metal bump is disposed on an electrode pad of the substrate; irradiating an infrared light toward the substrate together with the holding element from a backside of the substrate, observing a reflected light, and monitoring the electrode pad disposed under the second metal bump based on the reflected light, wherein the infrared light penetrates the holding element and the substrate, and reflected on the electrode pad so that the reflected light is provided, and wherein the monitoring element faces the bonding element through the holding element, the substrate and the package; and determining a state of a bonding surface between the first metal bump and the second metal bump based on monitoring information of the electrode pad.

In the above method, the semiconductor package judged as an not-preferable bonding state through a determination element is not flowed to a subsequent process and is excluded. On the other hand, the semiconductor package determined as a preferable bonding state through the determination element is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved.

According to a fourth aspect of the present disclosure, a manufacturing method for a semiconductor package includes: holding a substrate and the semiconductor package on a holding member; bonding a first metal bump for a circuit of the semiconductor package to a second metal bump for a circuit of the substrate, and bonding a third metal bump for determining a bonding state between the first and second metal bumps to a fourth metal bump for determining the bonding state with using a bonding element, wherein the first and third metal bumps are disposed on the semiconductor package, and wherein the second metal bump is disposed on an electrode pad of the substrate, and the fourth metal bump is disposed on another electrode pad of the substrate; irradiating an infrared light toward the substrate together with the holding element from a backside of the substrate, observing a reflected light, and monitoring the another electrode pad disposed under the fourth bump based on the reflected light, wherein the infrared light penetrates the holding element and the substrate, and reflected on the another electrode pad so that the reflected light is provided, and wherein the monitoring element faces the bonding element through the holding element, the substrate and the package; and determining the bonding state based on monitoring information of the another electrode pad.

In the above method, the semiconductor package judged as an not-preferable bonding state through a determination element is not flowed to a subsequent process and is excluded. On the other hand, the semiconductor package determined as a preferable bonding state through the determination element is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved. Specifically, it is possible to judge whether the bonding state of the first metallic bump and the second metallic bump is good or not on the basis of the monitoring information obtained by monitoring the portion just below the electrode pad forming the fourth metallic bump.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1:
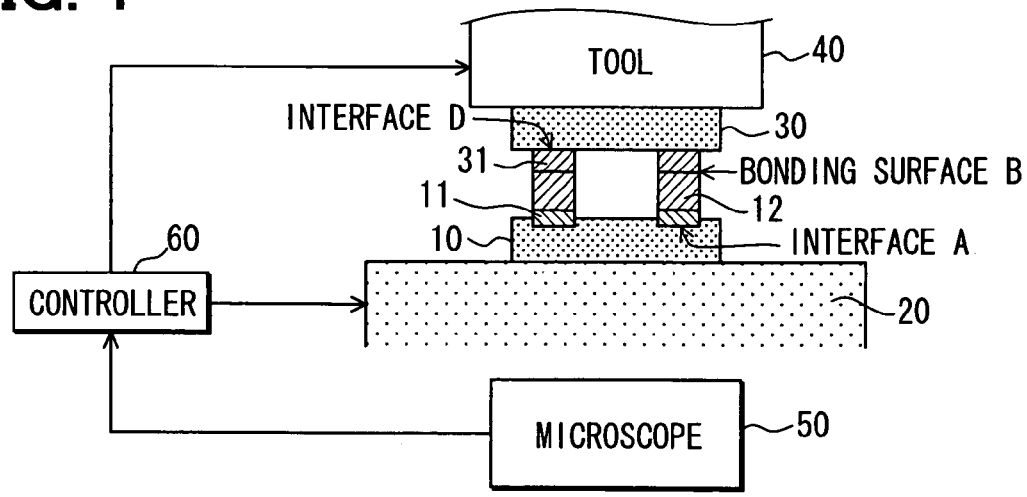
FIG. 1 is a schematic side view showing a manufacturing device of a semiconductor package according to a first embodiment.

A first embodiment mode of a manufacturing device of a semiconductor package and a manufacturing method of the semiconductor package will next be explained with reference to FIGS. 1 to 4. FIG. 1 is a schematic view in which the manufacturing device of the semiconductor package of this embodiment mode is shown from a side face direction by including the semiconductor package and a mounting substrate.

As described in detail below, this embodiment mode uses the manufacturing device of the semiconductor package in which an infrared ray microscope 50 is first arranged in a state opposed to a joining tool 40 through a stage 20, a mounting substrate 10 and a semiconductor package 30. Just after a first metallic bump 31 of the semiconductor package 30 is joined to a second metallic bump 12 of the mounting substrate 10, it is judged whether a joining state of a joining face B of the first metallic bump 31 and the second metallic bump 12 is good or not. Thus, production efficiency is improved while generation of an inferior product is restrained.

As shown in FIG. 1, the manufacturing device of the semiconductor package of this embodiment mode is constructed as a structure in which the semiconductor package 30 having the first metallic bump 31 for circuit formation on one face and constructed by an electronic part is mounted to the mounting substrate 10 having an electrode pad 11 forming the second metallic bump 12 for circuit formation on one face. First, these mounting substrate 10 and semiconductor package 30 will be explained.

For example, the mounting substrate 10 is formed by a material for transmitting infrared light such as silicon, etc. Further, as shown in FIG. 1, plural (two in this embodiment mode) electrode pads 11 are formed by e.g., aluminum (Al) on an upper face of such a mounting substrate 10. Plural (two in this embodiment mode) second metallic bumps 12 for circuit formation are respectively formed by e.g., gold (Au) on these plural electrode pads 11. Further, an unillustrated alignment mark set to a reference in position-aligning the mounting substrate 10 and the semiconductor package 30 is formed in a suitable position of the surface of the mounting substrate 10 by a suitable material transmitting no infrared light.

The semiconductor package 30 is constructed by arranging plural (two in this embodiment mode) first metallic bumps 31 for circuit formation constructed by e.g., gold (Au) on its surface. Further, similar to the mounting substrate 10, an unillustrated alignment mark set to a reference in position-aligning the mounting substrate 10 and the semiconductor package 30 is formed on the surface of the semiconductor package 30 by a suitable material transmitting no infrared light. However, its forming position is formed in a suitable position opposed to no alignment mark formed in the mounting substrate 10.

Next, the manufacturing device of the semiconductor package of this embodiment mode for manufacturing the semiconductor package by joining the first metallic bump 31 of the semiconductor package 30 to the second metallic bump 12 of the mounting substrate 10 will be explained.

As shown in FIG. 1, this manufacturing device is basically constructed by arranging the stage 20 (holding means), the joining tool 40 (joining means), the infrared ray microscope 50 (image pickup means and monitoring means) and a judging control section 60 (judging means). The stage 20 holds the mounting substrate 10 and variably sets the position of this mounting substrate 10. The joining tool 40 holds the semiconductor package 30 so as to oppositely come in contact with the mounting substrate 10 placed on this stage 20, and applies ultrasonic vibration to the first and second metallic bumps 31 and 12. The infrared ray microscope 50 picks up the image of a portion (interface A) just below the electrode pad 11 forming the second metallic bump 12, of the mounting substrate 10 by using infrared light over the mounting substrate 10 and the stage 20. The judging control section 60 judges whether a joining state of a joining face B of the first and second metallic bumps 31 and 12 is good or not on the basis of image information (monitoring information) obtained through the infrared ray microscope 50.

More particularly, similar to the previous mounting substrate 10, for example, the stage 20 is formed by a material for transmitting infrared light such as silicon, quartz glass, sapphire, etc. The mounting substrate 10 is placed in a predetermined position of an upper face of this stage 20 in a state in which a forming face of the electrode pad 11 and the second metallic bump 12 is directed upward. However, there is a fear that the mounting substrate 10 is moved at a joining time of the first and second metallic bumps 31 and 12 by only placing the mounting substrate 10. Therefore, the stage 20 receives commands from the judging control section 60 and operates an unillustrated suitable adsorbing mechanism arranged in the above predetermined position of the stage 20. Thus, the mounting substrate 10 is adsorbed and held in the above predetermined position. Further, the stage 20 variably sets the position of the adsorbed and held mounting substrate 10 by receiving commands from the judging control section 60 and moving the stage 20 itself. More particularly, the stage 20 makes the second metallic bump 12 of the mounting substrate 10 oppositely come in contact with the first metallic bump 31 of the semiconductor package 30 by moving the stage 20 itself. A using method of the alignment mark formed in each of the mounting substrate 10 and the semiconductor package 30 will be described later.

As shown in FIG. 1, the joining tool 40 receives commands from the judging control section 60 and adsorbs and holds the semiconductor package 30 in a predetermined position in a state in which a formed face of the first metallic bump 31 of the semiconductor package 30 is opposed to formed faces of the electrode pad 11 and the second metallic bump 12 of the mounting substrate 10 adsorbed and held in the stage 20, i.e., is directed downward. Similar to the previous stage 20, this joining tool 40 also has an unillustrated suitable adsorbing mechanism in a predetermined position, and adsorbs and holds the semiconductor package 30. Further, when the first and second metallic bumps 31 and 12 come in contact with each other, the joining tool 40 receives commands from the judging control section 60 and applies ultrasonic vibration to these first and second metallic bumps 31 and 12 at predetermined frequency and amplitude.

As shown in FIG. 1, in this embodiment mode, the infrared ray microscope 50 is arranged below the stage 20 in a state opposed to the joining tool 40 through the stage 20, the mounting substrate 10 and the semiconductor package 30. The infrared ray microscope 50 irradiates infrared light upward, i.e., toward the stage 20 and the mounting substrate 10 from the rear face side of the mounting substrate 10. The infrared ray microscope 50 forms an image (information) by receiving reflected light of the irradiated infrared light. As mentioned above, the mounting substrate 10 and the stage 20 are formed by a material for transmitting infrared light. Accordingly, these mounting substrate 10 and stage 20 transmit the infrared light irradiated from the infrared ray microscope 50, and this infrared light is not reflected and is also not received. Therefore, no image is picked up by the infrared ray microscope 50. On the other hand, no infrared light is transmitted through the electrode pad 11, the second metallic bump 12 and the alignment mark formed in the mounting substrate 10, and the first metallic bump 31 and the alignment mark, etc. formed in the semiconductor package 30. Therefore, the infrared light irradiated from the infrared ray microscope 50 is reflected and this reflected light is picked up as an image by the infrared ray microscope 50. However, when the first and second metallic bumps 31 and 12 are perfectly opposed through the movement of the stage 20, the infrared light irradiated from the infrared ray microscope 50 is reflected on a lower face (interface A) of the electrode pad 11. Therefore, images of the second and first metallic bumps 12 and 31 just above the electrode pad 11, i.e., an image of these joining face B is not picked up by the infrared ray microscope 50. Further, as mentioned above, the alignment mark formed in a suitable position of the mounting substrate 10 and the alignment mark formed in a suitable position of the semiconductor package 30 are formed in positions not opposed to each other. Therefore, each infrared light irradiated from the infrared ray microscope 50 is reflected. Namely, images of these alignment marks are picked up by the infrared ray microscope 50.

A manufacturing method of the semiconductor package using the manufacturing device of the semiconductor package constructed as mentioned above will be explained together with reference to FIGS. 2 to 4. With respect to the manufacturing method of the semiconductor package of this embodiment mode, FIG. 2 is a flow chart showing its processing procedure.

Figure 2:
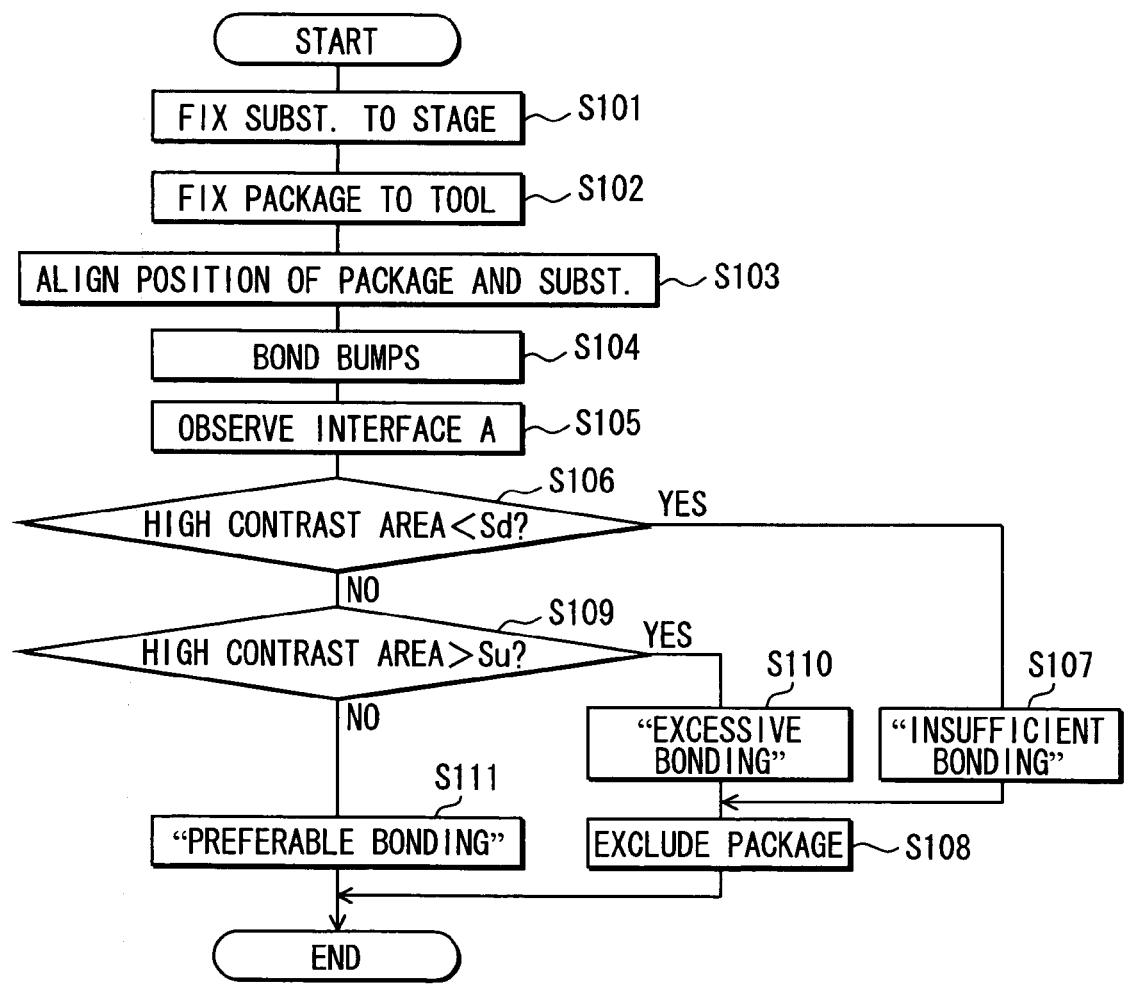
FIG. 2 is a flow chart showing a manufacturing method of the package.

As shown in this FIG. 2, the mounting substrate 10 is first fixed to the stage 20 as processing of step S101 so as to mount the semiconductor package 30 to the mounting substrate 10. More particularly, the mounting substrate 10 is placed in a predetermined position of the upper face of the stage 20 in a state in which the forming faces of the electrode pad 11 and the second metallic bump 12 are directed upward. When the mounting substrate 10 is placed in this way, the judging control section 60 adsorbs and fixes this mounting substrate 10 in the above predetermined position with respect to the stage 20.

Next, the semiconductor package 30 is fixed to the joining tool 40 as processing of subsequent step S102. More particularly, the semiconductor package 30 is adsorbed and held in a predetermined position such that a formed face of the first metallic bump 31 of the semiconductor package 30 is opposed to the forming faces of the electrode pad 11 and the second metallic bump 12 of the mounting substrate 10 adsorbed and held in the stage 20. In this embodiment mode, after the mounting substrate 10 is fixed to the stage 20 through the processing of step S101, the semiconductor package 30 is fixed to the joining tool 40 through the processing of step S102. However, these processings of step S101 and step S102 may be also executed in a reverse order.

Here, the judging control section 60 repeatedly executes acquisition of image information through the infrared ray microscope 50 at the interval of a predetermined time although this construction is omitted in the drawings. Before joining processing of the first and second metallic bumps 31 and 12 described later, the judging control section 60 executes position alignment processing of the mounting substrate 10 and the semiconductor package 30 on the basis of the image information obtained through the infrared ray microscope 50 as processing of subsequent step S103.

As mentioned above, the alignment marks are respectively formed by a material for transmitting no infrared light in the mounting substrate 10 and the semiconductor package 30. Accordingly, these alignment marks are projected-out in the image information obtained through the infrared ray microscope 50. Therefore, the judging control section 60 can recognize the positions of the mounting substrate 10 and the semiconductor package 30. Further, the judging control section 60 stores and holds the picked-up image information to a suitable memory holding means in advance in a state in which the mounting substrate 10 and the semiconductor package 30 are located in target positions. The judging control section 60 moves the above stage 20 while the stored and held image information and image information obtained every predetermined time are compared such that the position of the alignment mark included in the image information obtained every predetermined time is conformed to the position of the alignment mark included in the stored and held image information. Thus, the position alignment of the mounting substrate 10 and the semiconductor package 30 is executed.

Various kinds of parameter values such as the thickness of the mounting substrate 10, the thickness of the electrode pad 11, the height of the second metallic bump 12, the height of the semiconductor package 30, the height of the first metallic bump 31, etc. are also stored to the previous memory holding means in advance. The judging control section 60 also moves the stage 20 toward the joining tool 40 in consideration of such thicknesses and heights, etc. (vertical direction in FIG. 1). Thus, the judging control section 60 conforms both the alignment marks and makes the second metallic bump 12 of the mounting substrate 10 and the first metallic bump 31 of the semiconductor package 30 come in contact with each other.

Further, in this embodiment mode, the joining tool 40 is not moved and its position is fixedly set. The position alignment of the mounting substrate 10 and the semiconductor package 30 and the contact of the first and second metallic bumps 31 and 12 are executed by moving only the stage 20. Conversely, the stage 20 may be fixed and only the joining tool 40 may be also set to be moved. Further, both the stage 20 and the joining tool 40 may be also set to be movable. In short, it is sufficient that the positions of the mounting substrate 10 and the semiconductor package 30 can be aligned and the first bump 31 and the second metallic bump 12 can come in contact with each other.

Next, the judging control section 60 joins a portion between the metallic bumps as processing of step S104. More particularly, the judging control section 60 applies ultrasonic vibration to the first and second metallic bumps 31 and 12 for only a predetermined time at predetermined frequency and predetermined amplitude with respect to the joining tool 40. When the ultrasonic vibration is applied in this way, new generating faces of a forming material of these metallic bumps are joined to each other and these metallic bumps are joined by frictional heat in a contact portion (joining face B) of these first and second metallic bumps 31 and 12. Thus, the joining face B is thermally press-attached by ultrasonic wave. Such joining is gradually advanced while the ultrasonic vibration is applied from the joining tool 40. As this joining is advanced, the applied vibration also has an influence on another portion as well as the joining face. Namely, the vibration has an influence on a portion (interface A) just below the second metallic bump 12 of the mounting substrate 10, and a portion (interface D) just above the first metallic bump of the semiconductor package 30. A forming amount of a gold-aluminum alloy is increased at each interface. Accordingly, a predetermined correlative relation exists between the states of the interface A and the interface D and the state of the joining face B. Such a correlative relation is confirmed by the inventors of the present application.

The judging control section 60 then acquires the image information of the interface A of the electrode pad 11 and the mounting substrate 10 through the infrared ray microscope 50 as processing of subsequent step S105, and observes this image information. More particularly, as the joining of the first and second metallic bumps 31 and 12 is advanced, alloy formation in the electrode pad 11 is also advanced and the area of a portion formed as an alloy is gradually increased at the interface A.

Here, a reflecting amount of the infrared light irradiated from the infrared ray microscope 50 in a portion of a gold-aluminum alloy already formed as an alloy in the electrode pad 11 is smaller than that in a portion of aluminum not formed yet as an alloy in the electrode pad 11. Therefore, the portion of gold-aluminum already formed as an alloy is darkly seen in comparison with the portion of aluminum not formed as an alloy. Namely, when the joining is advanced, the alloy formation is advanced. As its result, the area of a thick portion in a binarized image (i.e., binarization image) obtained through the infrared ray microscope 50 gradually becomes large.

Figure 3A:
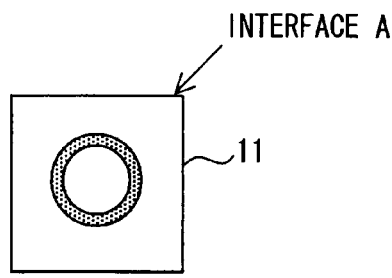
FIG. 3A is a binarization image of an interface A between a first metal bump and a second metal bump in case of insufficient bonding.
Figure 3B:
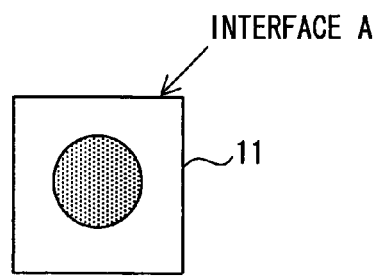
FIG. 3B is another binarization image in case of sufficient bonding.

Examples of such a binarized image are shown in FIGS. 3A and 3B. This FIG. 3A shows one example of the binarized image of the interface A obtained through the infrared ray microscope 50 when joining strength of the joining face B is insufficient. As shown in this FIG. 3A, when the joining strength of the joining face B is insufficient, no gold-aluminum alloy formation in the electrode pad 11 is advanced so much. Therefore, an annular thick portion merely appears at the center of the interface A and the area of the thick portion is small. On the other hand, FIG. 3B shows one example of the binarized image of the interface A obtained through the infrared ray microscope 50 when the joining strength of the joining face B is sufficient. As shown in this FIG. 3B, when the joining strength of the joining face B is sufficient, the gold-aluminum alloy formation in the electrode pad 11 is advanced. Therefore, a thick portion of a circular shape appears at the center of the interface A, and the area of the thick portion becomes large.

Figure 4:
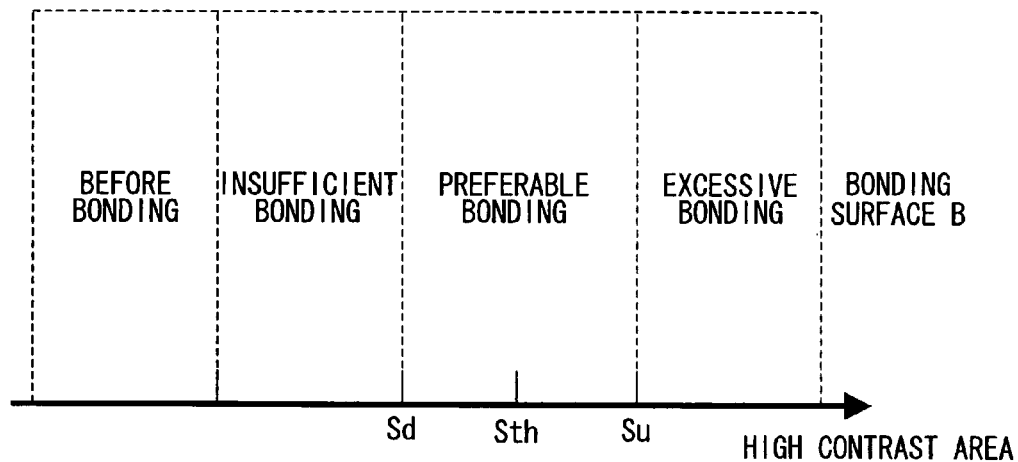
FIG. 4 is a chart showing a relationship between a high contrast area at the interface A and a state of a bonding surface B.

FIG. 4 shows the relation of the state of such a joining face (i.e., bonding surface) B and the thick portion area (i.e., high contrast area) of the interface A. As shown in this FIG. 4, as the joining state of the first and second metallic bumps 31 and 12 is advanced as in "before joining→insufficient joining→preferable joining state→excessive joining", the thick portion area of the interface A gradually becomes large. In this connection, when the joining face B is in an insufficient joining state, there is a fear that the first and second metallic bumps 31 and 12 are separated. On the other hand, when the joining face B is in an excessive joining state, the ultrasonic vibration is correspondingly applied to the first and second metallic bumps 31 and 12 for a long time. Therefore, there is a fear of high possibility that a crack is generated in the electrode pad 11 itself and a portion just below the electrode pad 11 of the mounting substrate 10. Further, "Sd" within FIG. 4 shows a lower limit value of the thick portion area of the interface A in which no separation is generated in the first and second metallic bumps 31 and 12. "Su" within FIG. 4 shows an upper limit value of the thick portion area of the interface A in which no crack is generated in the electrode pad 11 itself and a portion just below the electrode pad 11 of the mounting substrate 10. Further, "Sth" within FIG. 4 shows a most desirable value having a margin from each of these upper limit value Su and lower limit value Sd.

Thus, in this embodiment mode, the state of the interface A is directly monitored through the processing of the above step S105, and the joining state of the joining face B having the correlative relation shown in FIG. 4 with respect to the state of this interface A is indirectly monitored.

Figure 5:
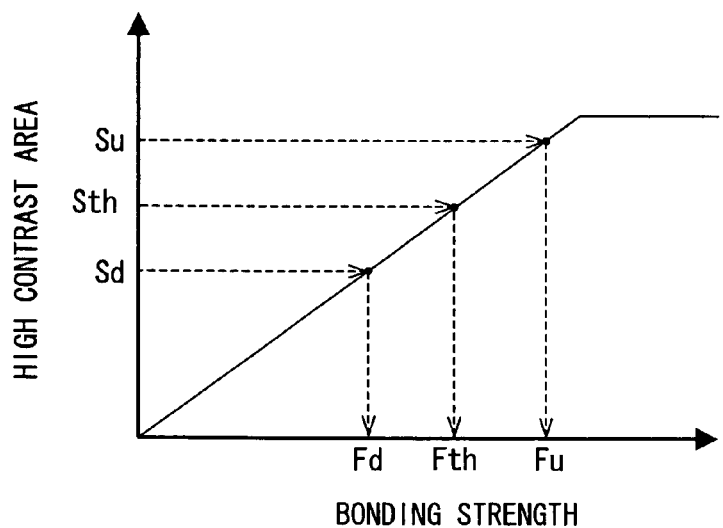
FIG. 5 is a graph showing a relationship between the high contrast area and the bonding strength.

FIG. 5 shows the relation of the thick portion area of the interface A shown in the previous FIG. 4 and the joining state of the joining face B as the relation of the thick portion area of the interface A and the joining strength (i.e., bonding strength) of the joining face B. The judging control section 60 judges whether the thick portion area among the image information acquired in this way is smaller than the lower limit value Sd shown in this FIG. 5 or not as judgment processing of subsequent step S106. Here, when it is judged that the thick portion area is smaller than the lower limit value Sd (Yes), the judging control section 60 judges that the joining state of the joining face B is "insufficient joining" as processing of subsequent step S107. Further, the judging control section 60 excludes a semiconductor package judged as the insufficient joining as processing of step S108.

On the other hand, when it is judged that the thick portion area among the acquired image information is greater than the lower limit value Sd in the judgment processing of the previous step S106 (No), the judging control section 60 judges whether the thick portion area among the acquired image information is greater than the upper limit value Su or not in the judgment processing of subsequent step S109. When it is here judged that the thick portion area is greater than the upper limit value Su (Yes), the judging control section 60 judges that the joining state of the joining face B is "excessive joining" as processing of subsequent step S110. Further, the judging control section 60 excludes the semiconductor package judged as the excessive joining as processing of step S108. Thus, the semiconductor package having a defect can not reach a subsequent process through various kinds of processings of steps S106 to S110. Namely, generation of an inferior product can be restrained.

On the other hand, when it is judged that the thick portion area among the acquired image information is not greater than the upper limit value Su in the judgment processing of the previous step S109 (No), the judging control section 60 judges that the joining state of the joining face B is "a preferable joining state" as processing of subsequent step S111, and terminates manufacture processing of the semiconductor package.

In accordance with this embodiment mode, the infrared ray microscope 50 utilizes the manufacturing device arranged in a state opposed to the joining tool 40 through the stage 20, the mounting substrate 10 and the semiconductor package 30. Therefore, differing from the related art in which joining of the first metallic bump 31 and the second metallic bump 12 and monitoring (inspection) of the joining state of the joining face must be executed by separate equipments, these joining processing (process) and inspection processing (process) can be executed by the same equipment. Further, the semiconductor package judged as an unpreferable joining state of the joining face B through the judging control section 60 is not flowed to the subsequent process, but can be excluded. The semiconductor package judged as a preferable joining state of the joining face B can be flowed to the subsequent process as it is. Accordingly, generation of an inferior product of the semiconductor package can be restrained. Further, since it is also unnecessary to convey the semiconductor package to different equipment, production efficiency of the semiconductor package can be improved.

For example, the above first embodiment mode can be also executed as the following mode.

Figure 6:
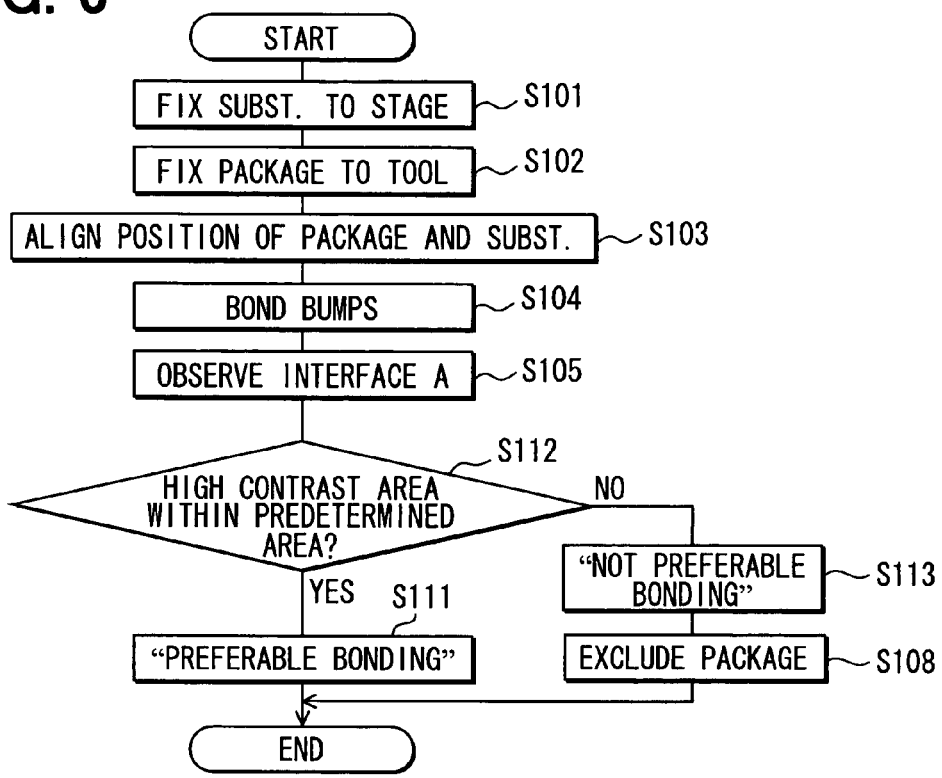
FIG. 6 is a flow chart showing a manufacturing method of the package according to a modification of the first embodiment.

In the above first embodiment mode, it is judged whether the joining state of the joining face B is "a preferable joining state", "insufficient joining" or "excessive joining" through various kinds of processings of steps S106 to S111. With respect to the semiconductor package having a defect, this defect is also distinguished. In addition, as shown in FIG. 6 as a view corresponding to the previous FIG. 2, the judging control section 60 judges whether the thick portion area among the acquired image information lies within a predetermined range (from lower limit value Sd to upper limit value Su) as judgment processing of step S112 or not. When the thick portion area lies within the predetermined range (Yes), it is judged that it is "a preferable joining state" as processing of subsequent step S111. On the other hand, when no thick portion area lies within the predetermined range (No), it may be also judged that "it is not a preferable joining state" as processing of subsequent step S113.

Figure 7:
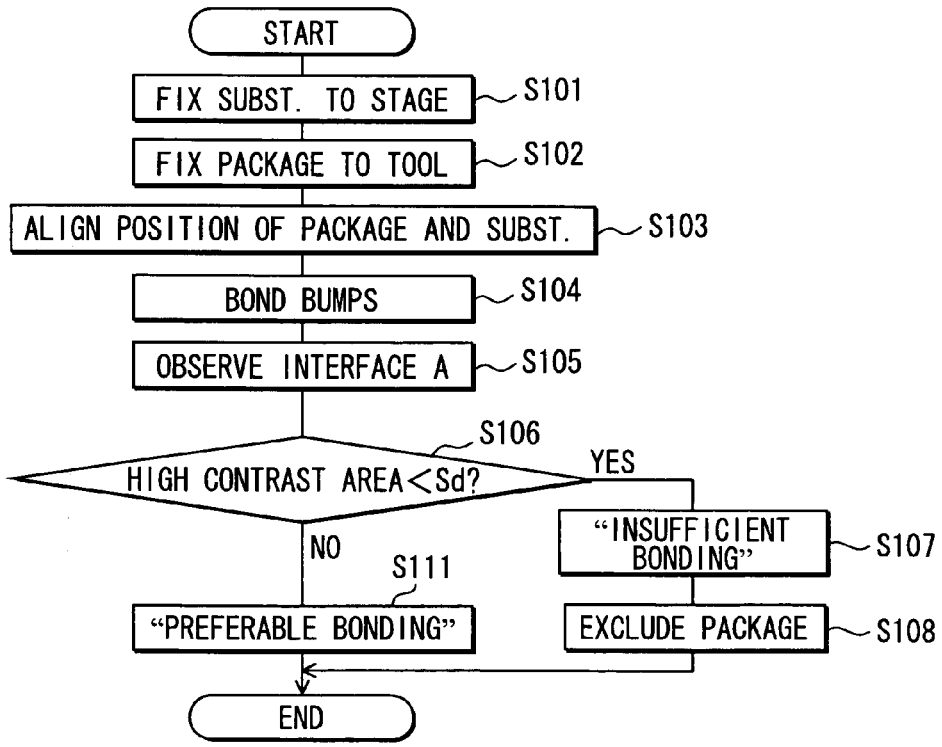
FIG. 7 is a flow chart showing a manufacturing method of the package according to a second modification of the first embodiment.

In the above first embodiment mode, the case that the joining state of the joining face B becomes "excessive joining" is small in consideration of joining processing (processing of step S104) for applying the ultrasonic vibration to the first and second metallic bumps 31 and 12 for only a predetermined time. Therefore, such defective judgment processing can be also omitted. Namely, as shown in FIG. 7 as a view corresponding to the previous FIG. 2, processings of steps S109 and S110 can be also omitted. Thus, generation of a defect can be restrained when the semiconductor package is mounted to the mounting substrate.

Second Embodiment Mode

Figure 8:
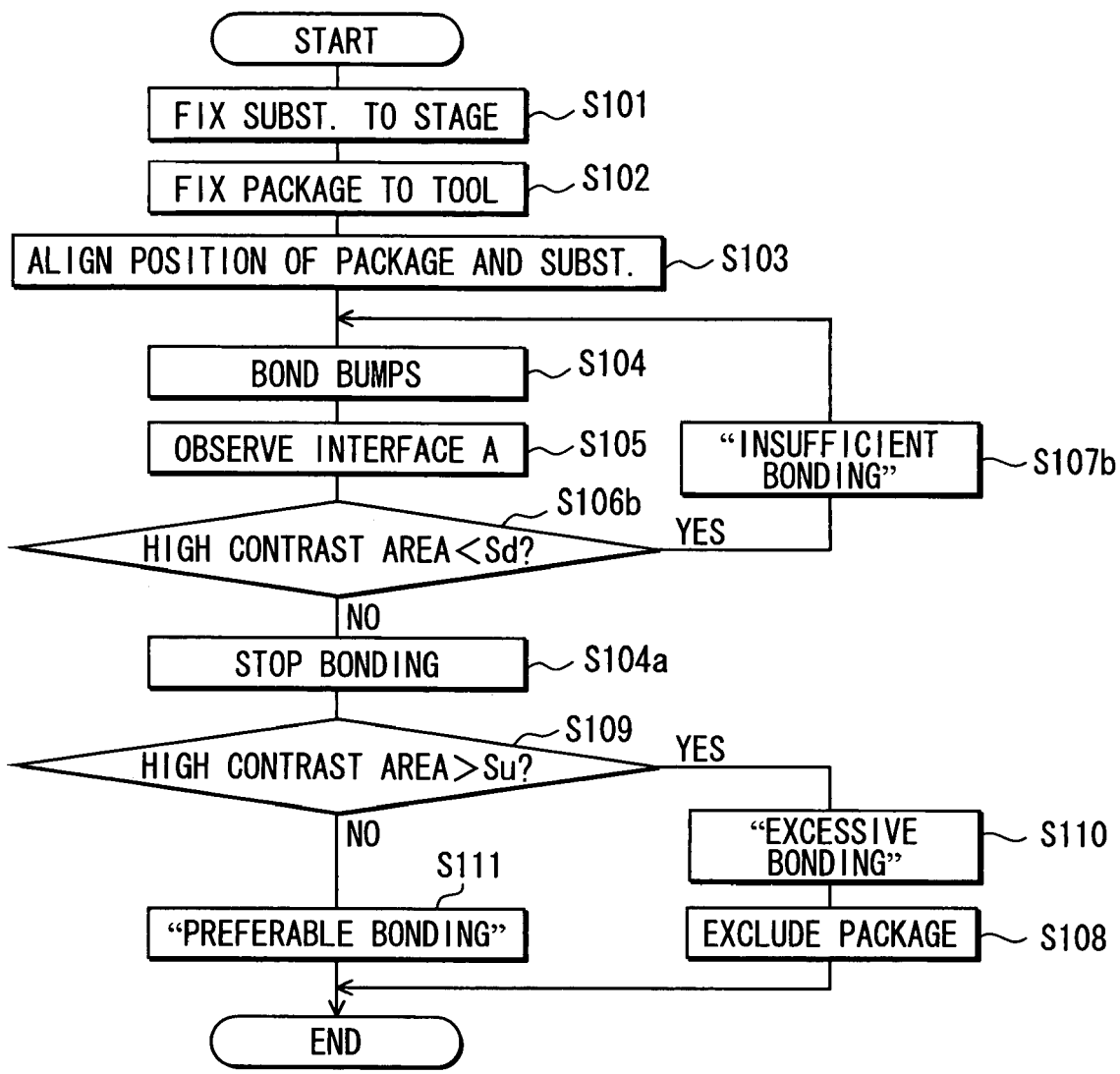
FIG. 8 is a flow chart showing a manufacturing method of the package according to a second embodiment.

Next, a second embodiment mode of the manufacturing device of the semiconductor package and the manufacturing method of the semiconductor package will be explained with reference to FIG. 8. This embodiment mode is a device and a method corresponding to those of the first embodiment mode shown in the previous FIGS. 1 to 5. In FIG. 8, the same elements as elements shown in the previous FIG. 2 are respectively designated by the same reference numerals. Overlapping explanations with respect to their respective elements are therefore omitted. FIG. 8 is a view corresponding to the previous FIG. 2, and is also a flow chart showing a processing procedure of this embodiment mode.

In the first embodiment mode shown in the previous FIG. 2, when it is judged that the joining state of the joining face B is "insufficient joining" through the judgment processing of step S106 and the processing of S107, the pertinent semiconductor package is excluded in the processing of subsequent step S108. The semiconductor package judged as "insufficient joining" in the joining state of the joining face B surely has a defect. However, such a semiconductor package does not have the defect of an excluded degree. It is rather desirable to continue the joining of the first and second metallic bumps 31 and 12 and preferably set the joining state of the joining face B in the joining tool 40.

More particularly, as shown in FIG. 8, the judging control section 60 judges whether the thick portion area among the image information obtained through the infrared ray microscope 50 is smaller than the lower limit value Sd shown in the previous FIG. 5 or not as the processing of step S106b. Here, when it is judged that the thick portion area is smaller than the lower limit value Sd (Yes), the judging control section 60 judges that the joining state of the joining face B is "insufficient joining" as the processing of subsequent step S107b. Further, it is fed back to the processing of step S104 as processing for applying the ultrasonic vibration to the first and second metallic bumps 31 and 12 through the joining tool 40. The judging control section 60 then again applies the ultrasonic vibration to the first and second metallic bumps 31 and 12 through the joining tool 40 as the processing of step S104. Further, the image information of interface A is acquired through the infrared ray microscope 50 as the processing of step S105. The judging control section 60 then again judges whether the thick portion area among the image information obtained through the infrared ray microscope 50 is smaller than the lower limit value Sd or not as the processing of subsequent step S106b. In this embodiment mode, a series of processings of such steps S104, S105, S106b and S107b is continuously executed in parallel. Namely, the judging control section 60 continues the application of the ultrasonic vibration to the first and second metallic bumps 31 and 12 while the image information is acquired until the thick portion area among the image information obtained by the infrared ray microscope 50 becomes greater than the lower limit value Sd through such a series of processings. Thus, when the thick portion area exceeds the lower limit value Sd, i.e., when the joining state of the joining face of the first and second metallic bumps 31 and 12 becomes a preferable joining state, the judging control section 60 terminates joining as the processing of subsequent step S104a. Thereafter, the judging control section 60 executes the processings of subsequent steps S109 to S111. However, these series of processings are processings corresponding to those of the previous first embodiment mode. Therefore, overlapping explanations are here omitted.

In accordance with this embodiment mode, the joining of the first metallic bump 31 to the above second metallic bump 12 is continued until it is judged that the joining state of the joining face B is preferable. Therefore, generation of an inferior product of the semiconductor package can be further restrained.

For example, the above second embodiment mode can be also executed as the following mode.

Figure 9:
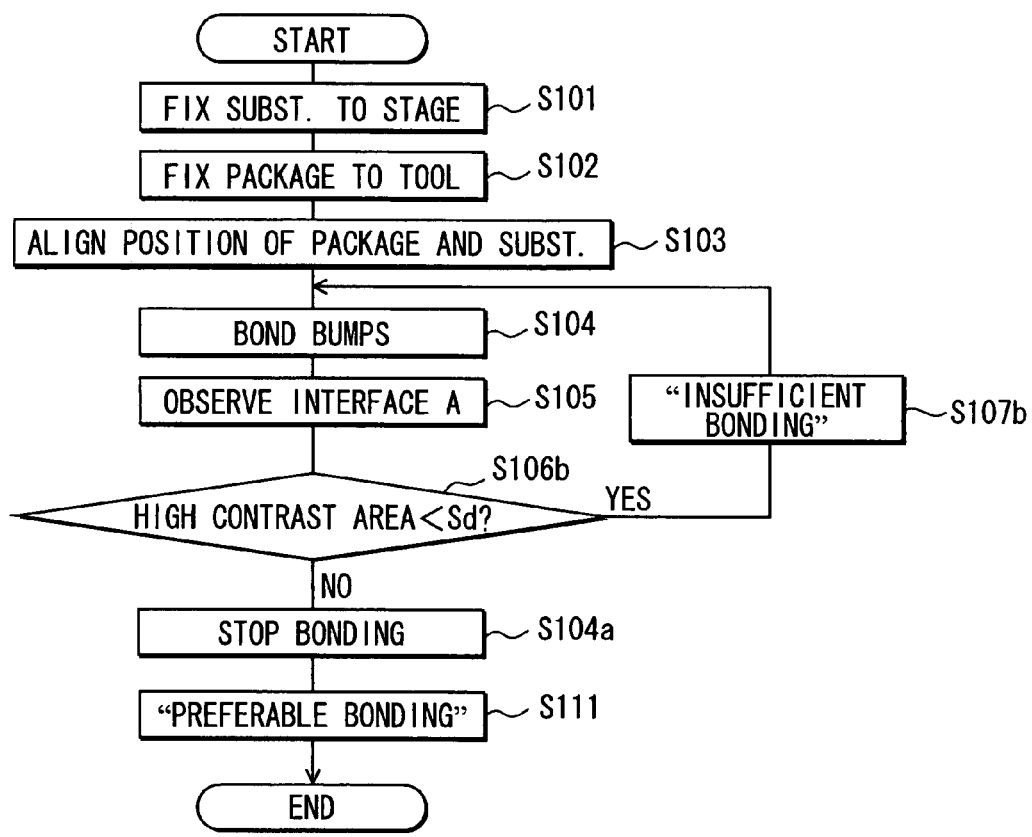
FIG. 9 is a flow chart showing a manufacturing method of the package according to a modification of the second embodiment.

In the above second embodiment mode, the judging control section 60 compulsorily sets the joining state of the joining face of the first and second metallic bumps 31 and 12 to a preferable joining state through a series of processings of steps S104 to S107b. Thereafter, the judging control section 60 further executes the processings of steps S108 to S110. Alternatively, as shown in FIG. 9 as a view corresponding to FIG. 8, various kinds of processings of steps S108 to S110 may be also omitted.

Third Embodiment Mode

Figure 10:
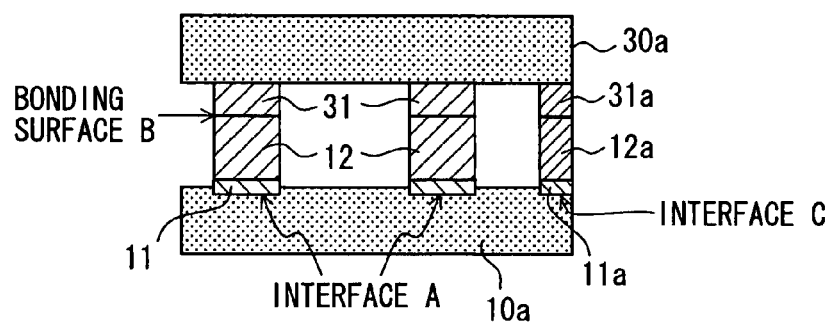
FIG. 10 is a schematic side view showing a semiconductor package and a mounting substrate according to a third embodiment.

Next, a third embodiment mode of the manufacturing device of the semiconductor package and the manufacturing method of the semiconductor package will be explained with reference to FIG. 10. In this FIG. 10, the same elements as elements shown in the previous FIGS. 1 to 9 are designated by the same reference numerals, and overlapping explanations with respect to their respective elements are omitted. FIG. 10 is a side view of a mounting substrate 10a and a semiconductor package 30a as manufacturing objects of the manufacturing device of the semiconductor package of this embodiment mode.

In this embodiment mode, as shown in this FIG. 10, the mounting substrate 10a and the semiconductor package 30a having a structure corresponding to that of the previous first embodiment mode are also set to its manufacturing object. Namely, in this embodiment mode, the semiconductor package 30a having the first metallic bump 31 for circuit formation and a third metallic bump 31a for a joining judgment on the same face and constructed by an electronic circuit is mounted to the mounting substrate 10a in which the electrode pad 11 forming the second metallic bump 12 for circuit formation and an electrode pad 11a forming a fourth metallic bump 12a for a joining judgment are arranged on the same face. Just after the first and third metallic bumps 12 and 12a with respect to the semiconductor package 30a are respectively joined to the second and fourth metallic bumps 31 and 31a of the mounting substrate 10a, it is judged whether the joining state of the joining face B of the first metallic bump 31 and the second metallic bump 12 is good or not. Thus, production efficiency is improved while generation of an inferior product is restrained.

As shown in FIG. 10, similar to the previous mounting substrate 10, for example, the mounting substrate 10a is formed by a material for transmitting infrared light such as silicon, etc. Further, as shown in FIG. 10, electrode pads 11 and 11a are formed by e.g., aluminum (Al) on the upper face of such a mounting substrate 10a. For example, the fourth metallic bump 12a for a joining judgment is formed by gold (Au) on the electrode pad 11a. However, the cross section of the third metallic bump 31a is formed so as to be smaller than that of the first metallic bump 31. The cross section of the fourth metallic bump 12a is formed so as to be smaller than that of the second metallic bump 12. Further, similar to the previous mounting substrate 10, an unillustrated alignment mark set to a reference in position alignment of the mounting substrate 10a and the semiconductor package 30a is also formed in the mounting substrate 10a by a suitable material for transmitting no infrared light in a suitable position of the surface of the mounting substrate 10a.

The semiconductor package 30a is constructed by arranging plural (two in this embodiment mode) first metallic bumps 31 for circuit formation constructed by e.g., gold (Au) on its surface. Similarly, in this embodiment mode, the semiconductor package 30a is constructed by arranging one third metallic bump 31a for a joining judgment constructed by e.g., gold (Au) on its surface. Further, similar to the mounting substrate 10, an unillustrated alignment mark set to a reference in position alignment of the mounting substrate 10a and the semiconductor package 30a is formed by a suitable material for transmitting no infrared light on the surface of the semiconductor package 30a. However, its forming position is formed in a suitable position not opposed to the alignment mark formed in the mounting substrate 10a.

Figure 11:
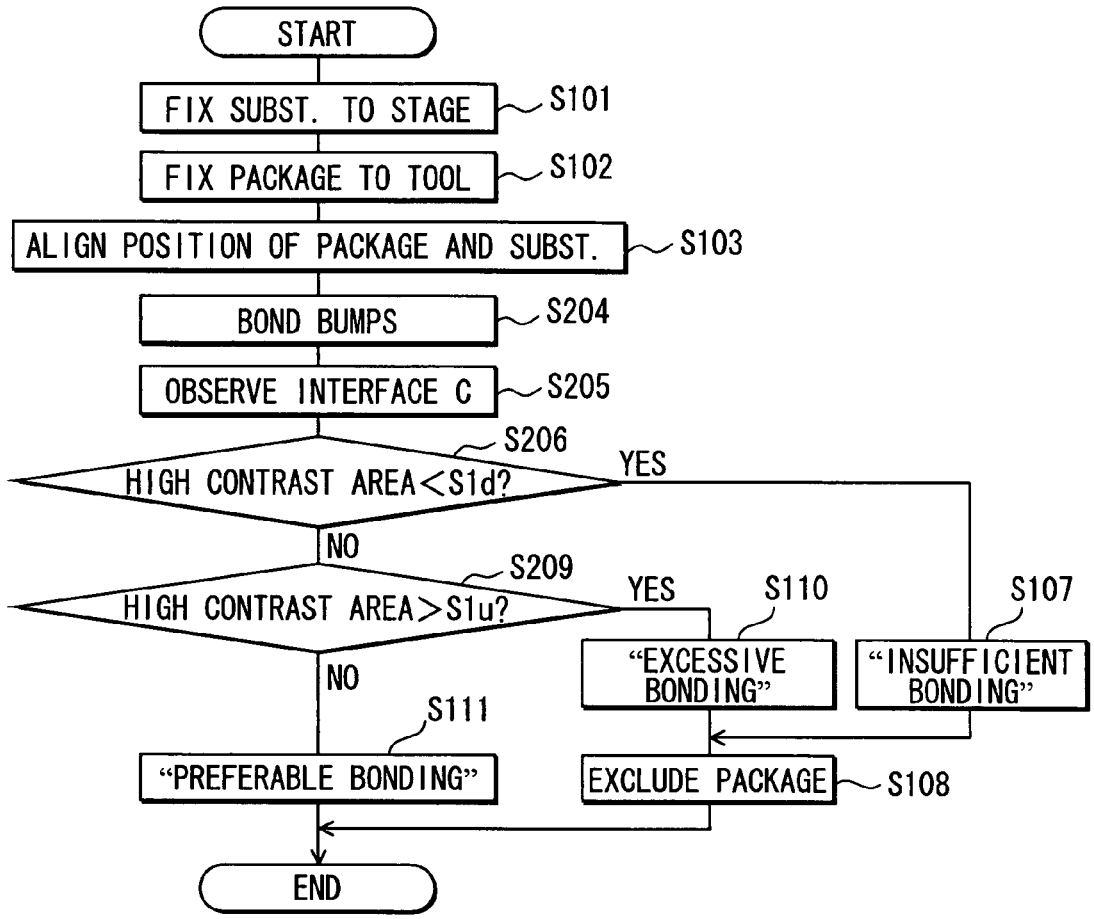
FIG. 11 is a flow chart showing a manufacturing method of the package according to the third embodiment.

The manufacturing method of the semiconductor package of this embodiment mode in which the mounting substrate and the semiconductor package having the above structure are set to a manufacturing object, will be explained together with reference to FIG. 11. With respect to the manufacturing method of the semiconductor package of this embodiment mode, FIG. 11 is a flow chart showing its processing procedure. As shown in this FIG. 11, the processing procedure in the manufacturing method of the semiconductor package of this embodiment mode is also a processing procedure corresponding to that of the first embodiment mode shown in the previous FIG. 2. However, in this embodiment mode, the judging control section 60 applies ultrasonic vibration to the first and second metallic bumps 31 and 12, and the third and fourth metallic bumps 31a and 12a for only a predetermined time at the same predetermined frequency and predetermined amplitude as the processing of step S204. Further, the judging control section 60 acquires image information of the interface C of the electrode pad 11a and the mounting substrate 10a through the infrared ray microscope 50 and observes this image information as judgment processing of step S205.

Next, reasons for judging whether the joining state of the joining face B is good or not on the basis of the image information of the interface C instead of the interface A will be explained.

In the processing of step S204, when the ultrasonic vibration is applied at the predetermined frequency and amplitude, both a contact portion of the first and second metallic bumps 31 and 12, and a contact portion of the third and fourth metallic bumps 31a and 12a are thermally press-attached by ultrasonic wave. Namely, the mounting substrate 10a and the semiconductor package 30a are electrically connected to each other, and are also mechanically connected. Similar to the first and second metallic bumps 31 and 12, an alloy of gold and aluminum is also formed, i.e., a gold-aluminum alloy is also generated in the third and fourth metallic bumps 31a and 12a during the joining of such metallic bumps. The state of the interface C of the electrode pad 11a and the mounting substrate 10a is also changed.

Here, the cross sections of the third and fourth metallic bumps 31a and 12a are formed so as to be smaller than the cross sections of the first and second metallic bumps 31 and 12. As mentioned above, the load stress of the interface C becomes greater than the load stress of the interface A.

Figure 12:
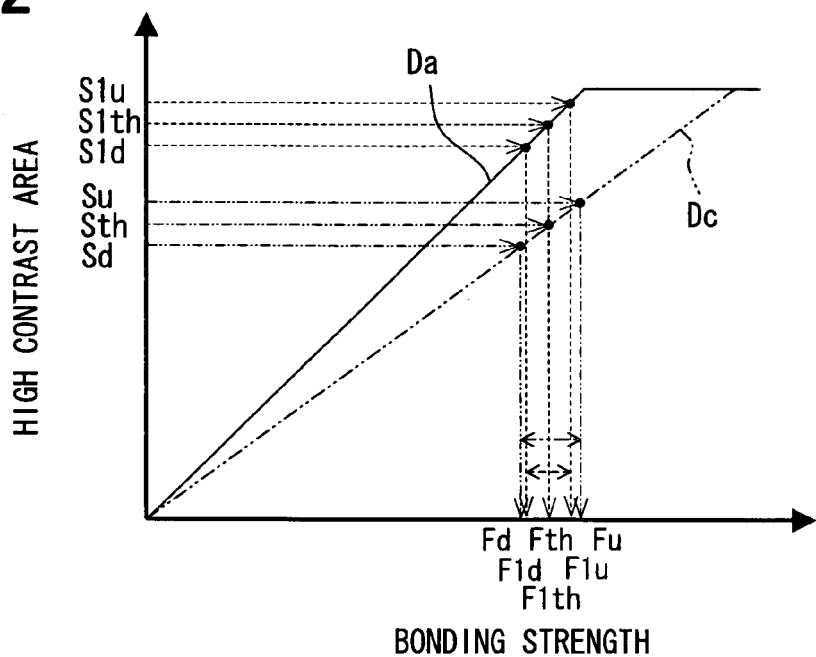
FIG. 12 is a graph showing a relationship between the high contrast area and the bonding strength, according to the third embodiment.

When the ultrasonic vibration is applied under the same condition, it is confirmed by the inventors that a forming-growing speed of the gold-aluminum alloy in the third and fourth metallic bumps 31a and 12a becomes greater than the forming-growing speed of the gold-aluminum alloy in the first and second metallic bumps 31 and 12. Further, in FIG. 12 as a view corresponding to the previous FIG. 5, the relation of the thick portion area of the interface A and the joining strength of the joining face B is shown as a straight line Da, and the relation of the thick portion area of the interface C and the joining state of the joining face B is shown as a straight line Dc by such a speed difference. As shown in FIG. 12, it is confirmed by the inventors that the inclination of the interface C becomes steeper than that of the interface A.

Dispersion of the joining state of the joining face B can be restrained by such a difference of the inclination. Namely, as shown in FIG. 10, the judging control section 60 judges whether the thick portion area of a binarized image of the interface C lies within a predetermined range from a lower limit value S1d shown in FIG. 12 to an upper limit value S1u shown in the same FIG. 12 or not through judgment processings of steps S206 and S209. When the thick portion area lies within this predetermined range, the judging control section 60 judges that the joining state of the joining face B is a preferable joining state as the processing of step S111. When the thick portion area lies within such a predetermined range, the joining strength of the joining face B lies in a range from a lower limit value F1d to an upper limit value F1u as shown in FIG. 12. On the other hand, on the basis of a judgment in which the thick portion area of the binarized image of the interface A lies in a predetermined range from the lower limit value Sd to the upper limit value Su shown together in FIG. 12, the joining strength of the joining face B at a time judged as a preferable joining state of the joining face B lies in a range from a lower limit value Fd to an upper limit value Fu as shown together in FIG. 12. As can be seen from this FIG. 12, the range from the lower limit value F1d to the upper limit value F1u is much narrower than the range from the lower limit value Fd to the upper limit value Fu. Thus, dispersion of the joining state of the joining face B can be restrained.

For example, the above third embodiment mode can be also executed as the following mode.

Various kinds of processings can be changed correspondingly to the previous first embodiment mode. Namely, in the processing of step S104 within the previous FIGS. 6 to 9, the ultrasonic vibration is also applied to the contact portion of the third and fourth metallic bumps 31a and 12a under the same condition as well as the contact portion of the first and second metallic bumps 31 and 12. In the processing of step S105 within the previous FIGS. 6 to 9, the interface C may be also observed instead of the interface A together with this application.

In the above third embodiment mode (including the modified examples), the cross sections of the third and fourth metallic bumps 31a and 12a are formed so as to be smaller than the cross sections of the first and second metallic bumps 31 and 12. Instead of this, hardness of the third and fourth metallic bumps 31a and 12a may be also formed so as to be greater than the hardness of the first and second metallic bumps 31 and 12. Otherwise, these settings of the cross section and the hardness may be also used together. In short, it is sufficient to form the first and second metallic bumps 31 and 12 and the third and fourth metallic bumps 31a and 12a such that the load stress of the interface C becomes greater than the load stress of the interface A. Thus, the relation of the thick portion area of the binarized image obtained through the infrared ray microscope 50 and the joining strength of the joining face B can be set to a steep linear relation.

Other Embodiment Modes

In each of the above embodiment modes (including the modified examples), the first to fourth metallic bumps 31, 12, 31a and 12a are formed by gold (Au), but no forming material is limited to gold. In addition, for example, the metallic bumps may be also formed by using copper (Cu), aluminum (Al) and nickel (Ni).

In each of the above embodiment modes (including the modified examples), when the positions of the first and third metallic bumps 31 and 31a of the semiconductor packages 30 and 30a, and the positions of the second and fourth metallic bumps 12 and 12a of the mounting substrates 10 and 10a are aligned, the alignment marks are respectively formed by a material for transmitting no infrared light in the semiconductor packages 30 and 30a and the mounting substrates 10 and 10a. In addition, these position alignments may be also executed by storing and holding wiring patterns within the semiconductor packages 30 and 30a in the above memory holding means, and aligning the alignment marks of the mounting substrates 10 and 10a with predetermined positions of the wiring patterns. In short, if the position alignment can be performed on the basis of image data picked up in the infrared ray microscope 50, its technique is arbitrary.

In each of the above embodiment modes (including the modified examples), when the mounting substrate 10 or 10a is placed in a predetermined position of the stage 20, a suitable adsorbing mechanism is operated and this mounting substrate is adsorbed and fixed. Alternatively, for example, the mounting substrate 10 or 10a may be also mechanically fixed in a predetermined position of the stage 20 by using a suitable mechanism. In short, if the mounting substrate 10 or 10a can be fixed to a predetermined position of the stage 20, a fixing method is arbitrary.

In each of the above embodiment modes (including the modified examples), when it is judged whether the joining state of the joining face B is good or not, it is based on the thick portion area of the binarized image obtained through the infrared ray microscope 50. In addition, for example, it may be also based on a ratio of the thick portion area occupied in the binarized image.

The above disclosure has the following aspects.

According to a first aspect of the present disclosure, a manufacturing device of a semiconductor package for bonding a first metal bump of the semiconductor package to a second metal bump of a substrate, wherein the second metal bump is disposed on an electrode pad of the substrate, the device includes: a holding element for holding the substrate; a bonding element for holding the semiconductor package, and for bonding the first metal bump to the second metal bump; a monitoring element for irradiating an infrared light toward the substrate together with the holding element from a backside of the substrate, for observing a reflected light, and for monitoring the electrode pad disposed under the second metal bump based on the reflected light, wherein the infrared light penetrates the holding element and the substrate, and reflected on the electrode pad so that the reflected light is provided; and a determination element for determining a state of a bonding surface between the first metal bump and the second metal bump based on monitoring information of the electrode pad. The monitoring element faces the bonding element through the holding element, the substrate and the package.

It is naturally desirable to directly monitor the joining state of the joining face of a first metallic bump and a second metallic bump to judge whether the joining state of the joining face of the first metallic bump and the second metallic bump is good or not. However, these first metallic bump and second metallic bump themselves transmit no infrared light. Therefore, it is difficult to directly monitor the state of such a joining face. In the related art described in the column of the background art, when a wiring electrode constructed by aluminum of a semiconductor package and a metallic bump (corresponding to the second metallic bump) constructed by gold of a mounting substrate are joined, the joining state of these wiring metal and metallic bump is judged by utilizing a forming amount of an Al—Au alloy formed on this joining face. In this case, as also described in the column of the problem, a substrate already mounting a part is conveyed to another equipment different from equipment executing the joining. In this equipment, infrared light is irradiated from the rear face side of the semiconductor package, and the irradiated infrared light is transmitted through the semiconductor package, and is reflected at the interface of an aluminum film and the metallic bump. On the basis of this reflected light, the joining state of the joining face of the semiconductor package and the metallic bump is inspected. Thus, after a joining process is terminated, the semiconductor package is conveyed to another equipment for executing an inspecting process. Therefore, a reduction of production efficiency of the semiconductor package is caused.

In its respect, the inventors have found that a predetermined correlative relation exists between the joining state of the joining face of the first metallic bump and the second metallic bump, and the state of a portion just below the electrode pad forming the first and second metallic bumps of the mounting substrate (an interface of the semiconductor package and the mounting substrate and each electrode pad). Therefore, in the above construction as the manufacturing device of the semiconductor package, a monitoring means is arranged in a state opposed to a joining means through a holding means, the mounting substrate and the semiconductor package. Therefore, differing from the related art in which the joining of the first metallic bump and the second metallic bump and monitoring (inspection) as to whether the joining state of the joining face is good or not must be executed by different equipments, these joining and inspection can be executed by the same equipment. Namely, for example, the semiconductor package judged as an unpreferable joining state of the joining face of the first metallic bump and the second metallic bump through a judging means is not flowed to a subsequent process and is excluded. On the other hand, the semiconductor package judged as a preferable joining state of the joining face of the first metallic bump and the second metallic bump through the judging means is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved.

Alternatively, the determination element may determine the state of the bonding surface just after the bonding element bonds the first metal bump to the second metal bump.

Alternatively, the determination element may repeatedly determine the state of the bonding surface during the bonding element bonds the first metal bump to the second metal bump, and the bonding element stops bonding the first metal bump to the second metal bump when the determination element determines the state of the bonding surface as a preferable bonding state. In the above device, the joining of the first metallic bump to the second metallic bump is continued until it is judged that the joining state of the joining face is preferable. Therefore, generation of an inferior product of the semiconductor package can be further restrained.

According to a second aspect of the present disclosure, a manufacturing device for manufacturing a semiconductor package in such a manner that a first metal bump for providing a circuit of the semiconductor package is bonded to a second metal bump for providing a circuit of a substrate, and that a third metal bump for determining a bonding state between the first and second metal bumps is bonded to a fourth metal bump for determining the bonding state, wherein the first and third metal bumps are disposed on the semiconductor package, and wherein the second metal bump is disposed on an electrode pad of the substrate, and the fourth metal bump is disposed on another electrode pad of the substrate, the device includes: a holding element for holding the substrate; a bonding element for holding the semiconductor package, and for bonding the first metal bump to the second metal bump, and bonding the third metal bump to the fourth metal bump; a monitoring element for irradiating an infrared light toward the substrate together with the holding element from a backside of the substrate, for observing a reflected light, and for monitoring the another electrode pad disposed under the fourth bump based on the reflected light, wherein the infrared light penetrates the holding element and the substrate, and reflected on the another electrode pad so that the reflected light is provided; and a determination element for determining the bonding state between the first metal bump and the second metal bump based on monitoring information of the another electrode pad. The monitoring element faces the bonding element through the holding element, the substrate and the package.

In the above construction as the manufacturing device of the semiconductor package, a monitoring means is also arranged in a state opposed to the joining means through the holding means, the mounting substrate and the semiconductor package. Therefore, differing from the related art in which the joining of the first metallic bump and the second metallic bump and monitoring (inspection) as to whether the joining state of the joining face is good or not must be executed by different equipments, these joining and inspection can be executed by the same equipment.

Namely, for example, the semiconductor package judged as an unpreferable joining state of the joining face of the first metallic bump and the second metallic bump through a judging means is not flowed to a subsequent process and is excluded. On the other hand, the semiconductor package judged as a preferable joining state of the joining face of the first metallic bump and the second metallic bump through the judging means is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved.

However, in the above construction as the manufacturing device of the semiconductor package, third and fourth metallic bumps for a joining judgment are respectively formed in the semiconductor package and the electrode pad in addition to the first and second metallic bumps for circuit formation. Here, a predetermined correlative relation based on the material quality and outer shape of each metallic bump exists between the joining state of the joining face of the first metallic bump and the second metallic bump, and the joining state of the joining face of the third metallic bump and the fourth metallic bump. A predetermined correlative relation also exists between the joining state of the joining face of the third metallic bump and the fourth metallic bump, and monitoring information obtained by monitoring a portion just below the electrode pad forming the fourth metallic bump. These existences are confirmed by the inventors. Accordingly, it is possible to judge whether the joining state of the first metallic bump and the second metallic bump is good or not on the basis of the monitoring information obtained by monitoring the portion just below the electrode pad forming the fourth metallic bump.

Alternatively, the third metal bump may have a cross sectional area parallel to the substrate, the area which is smaller than a cross sectional area of the first metal bump, and the fourth metal bump may have a cross sectional area parallel to the substrate, the area which is smaller than a cross sectional area of the second metal bump.

Alternatively, the third metal bump may have a hardness, which is higher than a hardness of the first metal bump, and the fourth metal bump may have a hardness, which is higher than a hardness of the second metal bump.

The above predetermined correlative relation based on the material quality and outer shape of each metallic bump is provided as follows. Namely, when the cross section of the third metallic bump is smaller than the cross section of the first metallic bump and the cross section of the fourth metallic bump is smaller than the cross section of the second metallic bump, the joining between the third and fourth metallic bumps is early advanced in comparison with the joining between the first and second metallic bumps. Further, similarly, when the hardness of the third metallic bump is higher than the hardness of the first metallic bump and the hardness of the fourth metallic bump is higher than the hardness of the second metallic bump, the joining between the third and fourth metallic bumps is early advanced in comparison with the joining between the first and second metallic bumps. It is possible to judge whether the joining state of the first metallic bump and the second metallic bump is good or not by utilizing such a correlative relation.

According to a third aspect of the present disclosure, a manufacturing method for a semiconductor package includes: holding a substrate and the semiconductor package on a holding member; bonding a first metal bump for a circuit of the semiconductor package to a second metal bump for a circuit of the substrate with using a bonding element, wherein the second metal bump is disposed on an electrode pad of the substrate; irradiating an infrared light toward the substrate together with the holding element from a backside of the substrate, observing a reflected light, and monitoring the electrode pad disposed under the second metal bump based on the reflected light, wherein the infrared light penetrates the holding element and the substrate, and reflected on the electrode pad so that the reflected light is provided, and wherein the monitoring element faces the bonding element through the holding element, the substrate and the package; and determining a state of a bonding surface between the first metal bump and the second metal bump based on monitoring information of the electrode pad.

It is naturally desirable to directly monitor the joining state of the joining face of a first metallic bump and a second metallic bump to judge whether the joining state of the joining face of the first metallic bump and the second metallic bump is good or not. However, these first metallic bump and second metallic bump themselves transmit no infrared light. Therefore, it is difficult to directly monitor the state of such a joining face. In the related art described in the column of the background art, when a wiring electrode constructed by aluminum of a semiconductor package and a metallic bump (corresponding to the second metallic bump) constructed by gold of a mounting substrate are joined, the joining state of these wiring metal and metallic bump is judged by utilizing a forming amount of an Al—Au alloy formed on this joining face. In this case, as also described in the column of the problem, a substrate already mounting a part is conveyed to another equipment different from equipment executing the joining. In this equipment, infrared light is irradiated from the rear face side of the semiconductor package, and the irradiated infrared light is transmitted through the semiconductor package, and is reflected at the interface of an aluminum film and the metallic bump. On the basis of this reflected light, the joining state of the joining face of the semiconductor package and the metallic bump is inspected. Thus, after a joining process is terminated, the semiconductor package is conveyed to another equipment for executing an inspecting process. Therefore, a reduction of production efficiency of the semiconductor package is caused.

In its respect, the inventors have found that a predetermined correlative relation exists between the joining state of the joining face of the first metallic bump and the second metallic bump, and the state of a portion (an interface of the semiconductor package and the mounting substrate and an electrode pad) just below the electrode pad forming the first and second metallic bumps of the mounting substrate. Therefore, the above method as the manufacturing method of the semiconductor package utilizes a manufacturing device of the semiconductor package having a monitoring means arranged in a state opposed to a joining means through a holding means, the mounting substrate and the semiconductor package. Therefore, differing from the related art in which a joining process for executing the joining of the first metallic bump and the second metallic bump and a monitoring process for monitoring (inspecting) whether the joining state of the joining face is good or not must be executed by different equipments, these joining process and monitoring (inspecting) process can be executed by the same equipment. Namely, for example, the semiconductor package judged as an unpreferable joining state of the joining face of the first metallic bump and the second metallic bump in a judging process is not flowed to a subsequent process and is excluded. On the other hand, the semiconductor package judged as a preferable joining state of the joining face of the first metallic bump and the second metallic bump in the judging process is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved.

According to a fourth aspect of the present disclosure, a manufacturing method for a semiconductor package includes: holding a substrate and the semiconductor package on a holding member; bonding a first metal bump for a circuit of the semiconductor package to a second metal bump for a circuit of the substrate, and bonding a third metal bump for determining a bonding state between the first and second metal bumps to a fourth metal bump for determining the bonding state with using a bonding element, wherein the first and third metal bumps are disposed on the semiconductor package, and wherein the second metal bump is disposed on an electrode pad of the substrate, and the fourth metal bump is disposed on another electrode pad of the substrate; irradiating an infrared light toward the substrate together with the holding element from a backside of the substrate, observing a reflected light, and monitoring the another electrode pad disposed under the fourth bump based on the reflected light, wherein the infrared light penetrates the holding element and the substrate, and reflected on the another electrode pad so that the reflected light is provided, and wherein the monitoring element faces the bonding element through the holding element, the substrate and the package; and determining the bonding state based on monitoring information of the another electrode pad.

The above method as the manufacturing method of the semiconductor package also utilizes a manufacturing device of the semiconductor package having a monitoring means arranged in a state opposed to a joining means through a holding means, the mounting substrate and the semiconductor package. Therefore, differing from the related art in which a joining process for executing the joining of the first metallic bump and the second metallic bump and a monitoring process for monitoring (inspecting) whether the joining state of the joining face is good or not must be executed by different equipments, these joining process and monitoring (inspecting) process can be executed by the same equipment. Namely, for example, the semiconductor package judged as an unpreferable joining state of the joining face of the first metallic bump and the second metallic bump in a judging process is not flowed to a subsequent process and is excluded. On the other hand, the semiconductor package judged as a preferable joining state of the joining face of the first metallic bump and the second metallic bump in the judging process is flowed to the subsequent process as it is, etc. Thus, generation of an inferior product of the semiconductor package can be restrained. Further, it is also unnecessary to convey the semiconductor package to another equipment. Therefore, production efficiency of the semiconductor package can be improved.

However, in the above method as the manufacturing method of the semiconductor package, differing from the method described in the previous claim 13, the semiconductor package in which the third and fourth metallic bumps for a joining judgment are respectively formed in the semiconductor package and the electrode pad in addition to the first and second metallic bumps for circuit formation is manufactured.

Here, as mentioned above, a predetermined correlative relation based on the material quality and outer shape of each metallic bump exists between the joining state of the joining face of the first metallic bump and the second metallic bump, and the joining state of the joining face of the third metallic bump and the fourth metallic bump. A predetermined correlative relation also exists between the joining state of the joining face of the third metallic bump and the fourth metallic bump, and monitoring information obtained by monitoring a portion just below the electrode pad forming the fourth metallic bump. Accordingly, in a judging process, it is possible to judge whether the joining state of the first metallic bump and the second metallic bump is good or not on the basis of the monitoring information obtained by monitoring the portion just below the electrode pad forming the fourth metallic bump.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A manufacturing device of a semiconductor package for bonding a first metal bump of the semiconductor package to a second metal bump of a substrate, wherein the second metal bump is disposed on an electrode pad of the substrate, the device comprising:
    a holding element for holding the substrate;
    a bonding element for holding the semiconductor package, and for bonding the first metal bump to the second metal bump;
    a monitoring element for irradiating an infrared light toward the substrate together with the holding element from a backside of the substrate, for observing a reflected light, and for monitoring the electrode pad disposed under the second metal bump based on the reflected light, wherein the infrared light penetrates the holding element and the substrate, and reflected on the electrode pad so that the reflected light is provided; and
    a determination element for determining a state of a bonding surface between the first metal bump and the second metal bump based on monitoring information of the electrode pad, wherein
    the monitoring element faces the bonding element through the holding element, the substrate and the package.

2. The device according to claim 1, wherein
    the determination element determines the state of the bonding surface just after the bonding element bonds the first metal bump to the second metal bump.

3. The device according to claim 1, wherein
    the determination element repeatedly determines the state of the bonding surface during the bonding element bonds the first metal bump to the second metal bump, and
    the bonding element stops bonding the first metal bump to the second metal bump when the determination element determines the state of the bonding surface as a preferable bonding state.

4. The device according to claim 1, wherein
    the monitoring element is an imaging element with using the infrared light,
    the imaging element provides a binary image of the electrode pad,
    the determination element determines the state of the bonding surface as a preferable bonding state when a high contrast area of the binary image is in a predetermined range,
    the determination element determines the state of the bonding surface as a not-preferable bonding state when the high contrast area of the binary image is out of the predetermined range, and
    the high contrast area has a contrast higher than a predetermined value.

5. The device according to claim 1, wherein
    the bonding element applies a supersonic vibration to the first and second metal bumps to bond together.

6. A manufacturing device for manufacturing a semiconductor package in such a manner that a first metal bump for providing a circuit of the semiconductor package is bonded to a second metal bump for providing a circuit of a substrate, and that a third metal bump for determining a bonding state between the first and second metal bumps is bonded to a fourth metal bump for determining the bonding state, wherein the first and third metal bumps are disposed on the semiconductor package, and wherein the second metal bump is disposed on an electrode pad of the substrate, and the fourth metal bump is disposed on another electrode pad of the substrate, the device comprising:
    a holding element for holding the substrate;
    a bonding element for holding the semiconductor package, and for bonding the first metal bump to the second metal bump, and bonding the third metal bump to the fourth metal bump;
    a monitoring element for irradiating an infrared light toward the substrate together with the holding element from a backside of the substrate, for observing a reflected light, and for monitoring the another electrode pad disposed under the fourth bump based on the reflected light, wherein the infrared light penetrates the holding element and the substrate, and reflected on the another electrode pad so that the reflected light is provided; and
    a determination element for determining the bonding state between the first metal bump and the second metal bump based on monitoring information of the another electrode pad, wherein
    the monitoring element faces the bonding element through the holding element, the substrate and the package.

7. The device according to claim 6, wherein
    the third metal bump has a cross sectional area parallel to the substrate, the area which is smaller than a cross sectional area of the first metal bump, and
    the fourth metal bump has a cross sectional area parallel to the substrate, the area which is smaller than a cross sectional area of the second metal bump.

8. The device according to claim 6, wherein
    the third metal bump has a hardness, which is higher than a hardness of the first metal bump, and
    the fourth metal bump has a hardness, which is higher than a hardness of the second metal bump.

9. The device according to claim 6, wherein
    the determination element determines the bonding state just after the bonding element bonds the first metal bump to the second metal bump and the third metal bump to the fourth metal bump.

10. The device according to claim 6, wherein
    the determination element repeatedly determines the bonding state during the bonding element bonds the first metal bump to the second metal bump and the third metal bump to the fourth metal bump, and
    the bonding element stops bonding the first metal bump to the second metal bump and the third metal bump to the fourth metal bump when the determination element determines the bonding state as a preferable bonding state.

11. The device according to claim 6, wherein
    the monitoring element is an imaging element with using the infrared light,
    the imaging element provides a binary image of the another electrode pad,
    the determination element determines the bonding state as a preferable bonding state when a high contrast area of the binary image is in a predetermined range, the determination element determines the bonding state as a not-preferable bonding state when the high contrast area of the binary image is out of the predetermined range, and the high contrast area has a contrast higher than a predetermined value.

12. The device according to claim 6, wherein
the bonding element applies a supersonic vibration to the first to fourth metal bumps to bond together.

13. A manufacturing method for a semiconductor package comprising:
holding a substrate and the semiconductor package on a holding member;
bonding a first metal bump for a circuit of the semiconductor package to a second metal bump for a circuit of the substrate with using a bonding element, wherein the second metal bump is disposed on an electrode pad of the substrate;
irradiating an infrared light toward the substrate together with the holding element from a backside of the substrate, observing a reflected light, and monitoring the electrode pad disposed under the second metal bump based on the reflected light, wherein the infrared light penetrates the holding element and the substrate, and reflected on the electrode pad so that the reflected light is provided, and wherein the monitoring element faces the bonding element through the holding element, the substrate and the package; and
determining a state of a bonding surface between the first metal bump and the second metal bump based on monitoring information of the electrode pad.

14. The method according to claim 13, wherein
the determining the state is performed after the bonding the first metal bump.

15. The method according to claim 13, wherein
the determining the state is repeatedly performed during the bonding the first metal bump.

16. A manufacturing method for a semiconductor package comprising:
holding a substrate and the semiconductor package on a holding member;
bonding a first metal bump for a circuit of the semiconductor package to a second metal bump for a circuit of the substrate, and bonding a third metal bump for determining a bonding state between the first and second metal bumps to a fourth metal bump for determining the bonding state with using a bonding element, wherein the first and third metal bumps are disposed on the semiconductor package, and wherein the second metal bump is disposed on an electrode pad of the substrate, and the fourth metal bump is disposed on another electrode pad of the substrate;
irradiating an infrared light toward the substrate together with the holding element from a backside of the substrate, observing a reflected light, and monitoring the another electrode pad disposed under the fourth bump based on the reflected light, wherein the infrared light penetrates the holding element and the substrate, and reflected on the another electrode pad so that the reflected light is provided, and wherein the monitoring element faces the bonding element through the holding element, the substrate and the package; and
determining the bonding state based on monitoring information of the another electrode pad.

17. The method according to claim 16, wherein
the determining the state is performed after the bonding the first metal bump.

18. The method according to claim 16, wherein
the determining the state is repeatedly performed during the bonding the first metal bump.

* * * * *